US012034267B2

(12) United States Patent
Macomber

(10) Patent No.: US 12,034,267 B2
(45) Date of Patent: Jul. 9, 2024

(54) METHODS AND SYSTEMS FOR SPECTRAL BEAM-COMBINING

(71) Applicant: Daylight Solutions, Inc., San Diego, CA (US)

(72) Inventor: Steven H. Macomber, Tucson, AZ (US)

(73) Assignee: Daylight Solutions, Inc., San Diego, CA (US)

( * ) Notice: Subject to any disclaimer, the term of this patent is extended or adjusted under 35 U.S.C. 154(b) by 765 days.

(21) Appl. No.: 17/146,267

(22) Filed: Jan. 11, 2021

(65) Prior Publication Data

US 2021/0135423 A1 May 6, 2021

Related U.S. Application Data

(63) Continuation of application No. PCT/US2019/027238, filed on Apr. 12, 2019.
(Continued)

(51) Int. Cl.
*H01S 3/08* (2023.01)
*G02B 6/42* (2006.01)
(Continued)

(52) U.S. Cl.
CPC ........ *H01S 3/08009* (2013.01); *G02B 6/4296* (2013.01); *G02B 19/0057* (2013.01);
(Continued)

(58) Field of Classification Search
CPC ............ G02B 27/0905; G02B 27/0944; G02B 27/0994; G02B 27/1006; G02B 27/1073; G02B 27/1086; G02B 19/00; G02B 19/0052; G02B 19/0057; G02B 19/0076; B23K 26/0006; B23K 26/06; B23K 26/062; B23K 26/064; B23K 26/0648; B23K 26/0869; B23K 26/40; B23K 26/359; B23K 26/362; H01S 5/4012; H01S 5/4087; H01S 5/0071; H01S 5/02423; H01S 3/06737; H01S 3/08009; H01S 3/13; H01S 3/2391
See application file for complete search history.

(56) References Cited

U.S. PATENT DOCUMENTS 6,952,510 B1 10/2005 Karlsen et al.
8,526,110 B1 9/2013 Honea et al.
(Continued)

OTHER PUBLICATIONS

GB2100082.3 , "Intention to Grant", dated Nov. 18, 2022, 2 pages.
(Continued)

*Primary Examiner* — Sultan Chowdhury
(74) *Attorney, Agent, or Firm* — Kilpatrick Townsend & Stockton LLP

(57) ABSTRACT

A method of spectral beam-combining an array of fiber optics is disclosed. Each fiber may be coupled to a high-power, wavelength-stabilized, fiber-coupled, diode-laser module and has a fiber-by-fiber pre-selected wavelength. The wavelengths may be chosen such that the array can be spectrally combined on, for example a transmission grating and re-focused into an output fiber. This approach is scalable to, for example, 10 kW power and have a beam quality sufficient for metal cutting applications.

20 Claims, 11 Drawing Sheets

Related U.S. Application Data

(60) Provisional application No. 62/698,020, filed on Jul. 14, 2018.

(51) Int. Cl.
  *G02B 19/00* (2006.01)
  *G02B 27/10* (2006.01)
  *H01S 3/067* (2006.01)
  *H01S 3/08045* (2023.01)
  *H01S 3/13* (2006.01)
  *H01S 3/23* (2006.01)
  *H01S 5/40* (2006.01)
  *G02B 5/18* (2006.01)

(52) U.S. Cl.
  CPC ...... *G02B 27/1006* (2013.01); *H01S 3/06737* (2013.01); *H01S 3/08045* (2013.01); *H01S 3/13* (2013.01); *H01S 3/2391* (2013.01); *H01S 5/4012* (2013.01); *H01S 5/4087* (2013.01); *G02B 2005/1804* (2013.01)

(56) References Cited

U.S. PATENT DOCUMENTS

| | | | | |
|---|---|---|---|---|
| 9,134,538 | B1* | 9/2015 | Augst | H01S 5/4062 |
| 10,177,526 | B1* | 1/2019 | Bochove | H01S 3/2391 |
| 2008/0180787 | A1* | 7/2008 | DiGiovanni | G02B 6/02019 |
| | | | | 359/334 |
| 2010/0302644 | A1* | 12/2010 | Yalov | G02B 27/0172 |
| | | | | 359/630 |
| 2015/0003484 | A1* | 1/2015 | Muendel | H01S 5/1025 |
| | | | | 372/50.12 |
| 2015/0036218 | A1* | 2/2015 | Rothenberg | G02B 5/1861 |
| | | | | 359/576 |
| 2015/0241632 | A1* | 8/2015 | Chann | G02B 6/4296 |
| | | | | 385/27 |
| 2015/0323751 | A1* | 11/2015 | Zagoneanu | G02B 6/4269 |
| | | | | 385/134 |
| 2016/0285227 | A1 | 9/2016 | Farrow et al. | |
| 2017/0059403 | A1* | 3/2017 | Froehlich | H01S 5/0683 |
| 2017/0304940 | A1 | 10/2017 | Ogata | |
| 2018/0026425 | A1 | 1/2018 | Usuda | |
| 2018/0249642 | A1* | 9/2018 | Huang | F21V 23/0471 |

OTHER PUBLICATIONS

Application No. GB2100082.3 , Notice of Decision to Grant, dated Jan. 3, 2023, 2 pages.
Application No. TW108113645 , Notice of Decision to Grant, dated Feb. 17, 2023, 3 pages.
Application No. TW108113645 , Office Action, dated Aug. 18, 2022, 7 pages.
GB2100082.3 , "First Examination Report", dated Jan. 27, 2022, 2 pages.
International Search Report and Written Opinion dated Jul. 5, 2019 for PCT/US/2019/027238, 12 pages.

* cited by examiner

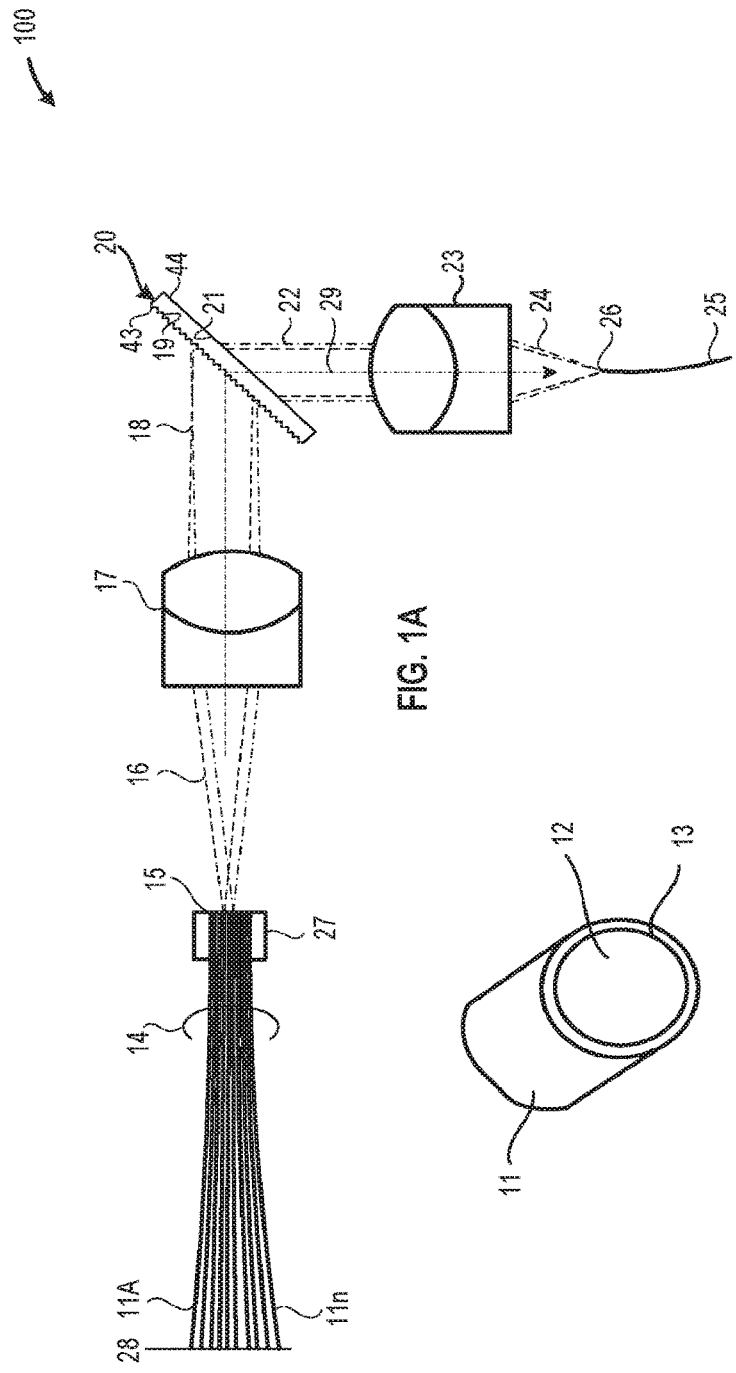
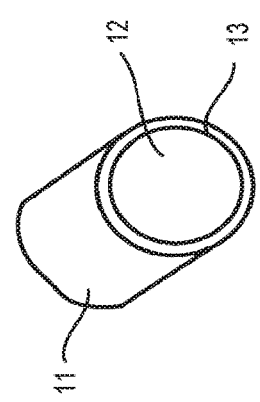
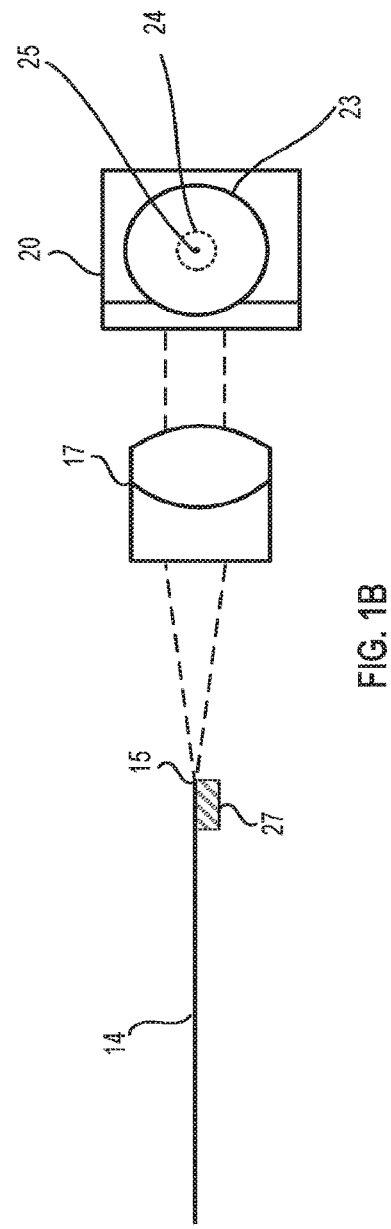

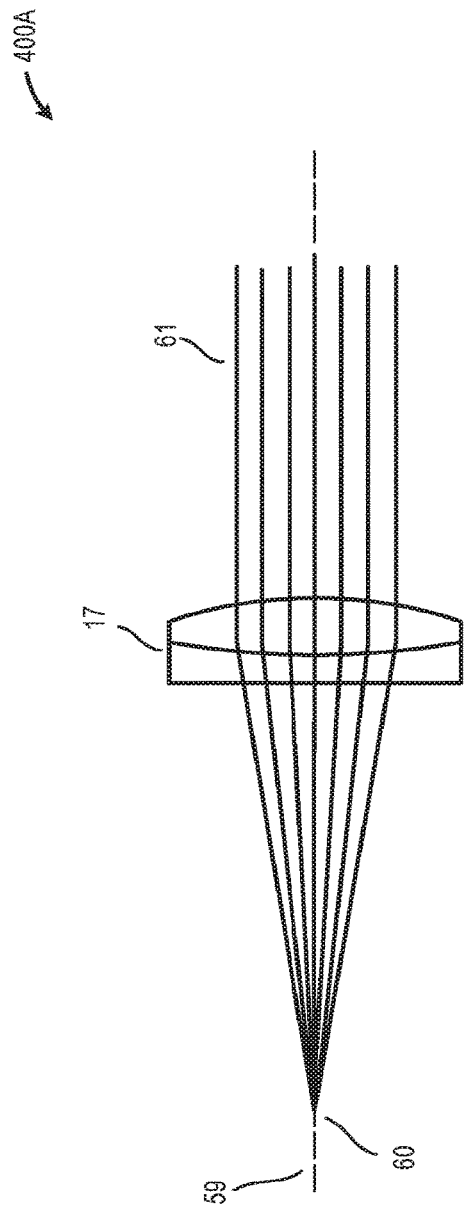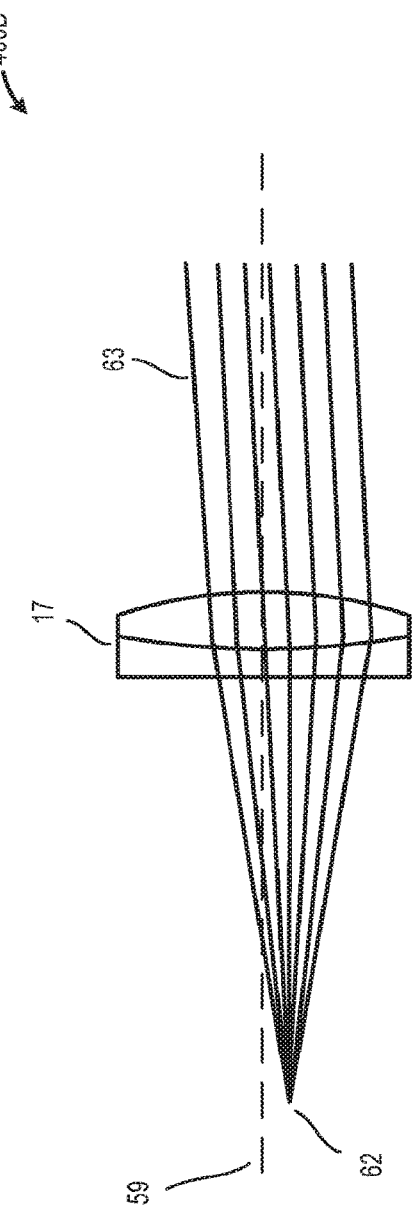
FIG. 4A
FIG. 4B

| PARAMETER | SYMBOL | VALUE |
|---|---|---|
| TOTAL OUTPUT POWER | $P_{total}$ | 2000 W |
| POWER PER FIBER | $P_{fiber}$ | 200 W |
| NUMBER OF FIBERS | $N$ | 10 |
| CENTER WAVELENGTH | $\lambda_0$ | 940 NM |
| GRATING PITCH | $\Lambda$ | 762 nm |
| TOTAL SPECTRAL RANGE | $\Delta\lambda_{range}$ | 90 nm |
| WAVELENGTH SPACING | $\Delta\lambda$ | 10 nm |
| FIBER SPACING | $D$ | 0.125 nm |
| SMALLEST LENS 1 FOCAL LENGTH | $F$ | 6 mm |

FIG. 6A

| FIBER NUMBER | WAVELENGTH (nm) |
|---|---|
| 1 | 900 |
| 2 | 910 |
| 3 | 920 |
| 4 | 930 |
| 5 | 940 |
| 6 | 950 |
| 7 | 970 |
| 8 | 980 |
| 9 | 980 |
| 10 | 990 |

FIG. 6B

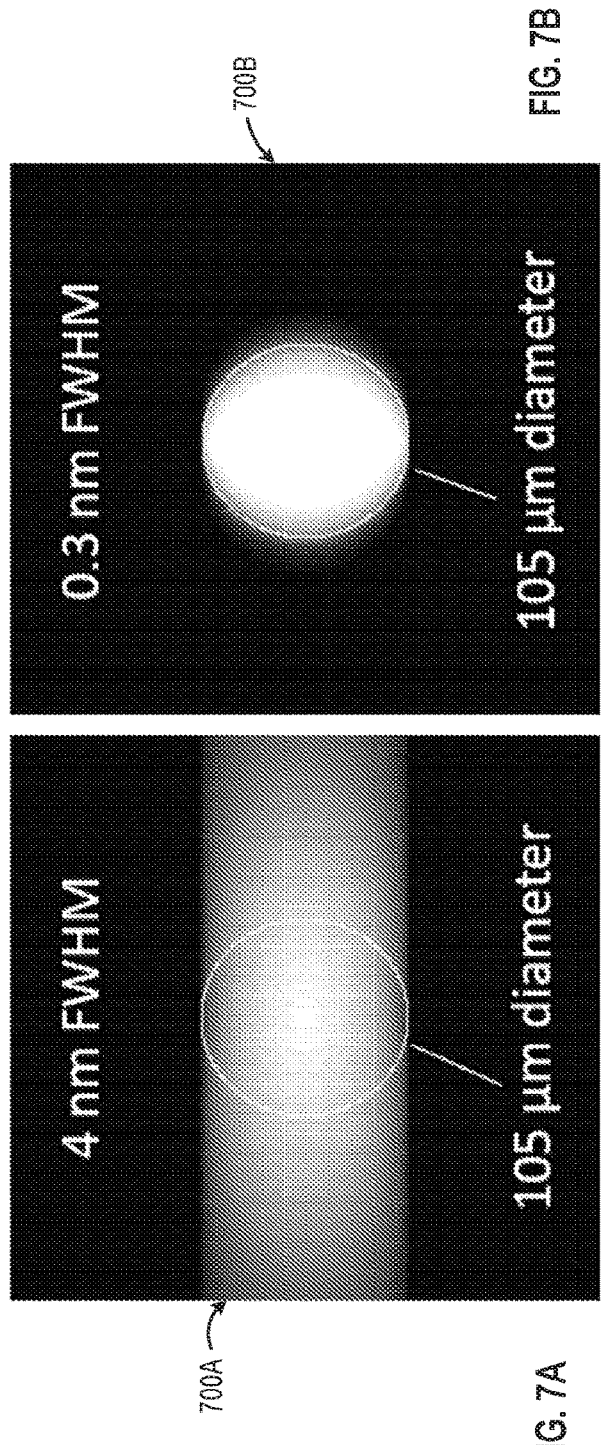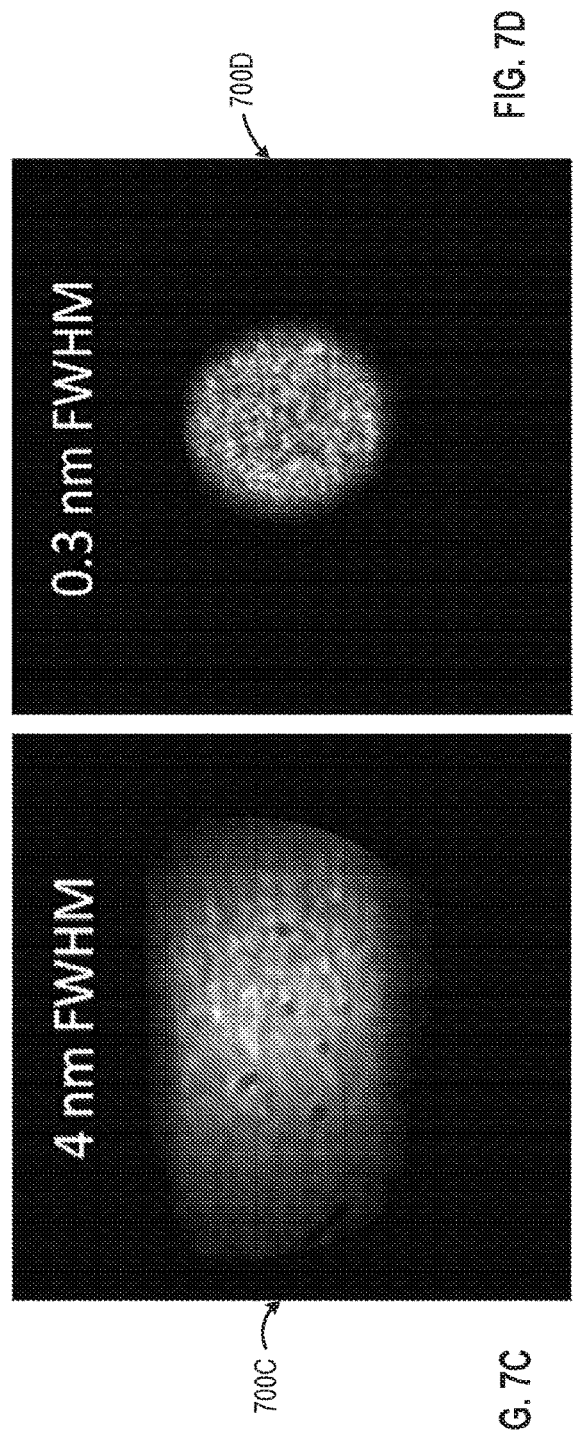
FIG. 7A  FIG. 7B  FIG. 7C  FIG. 7D

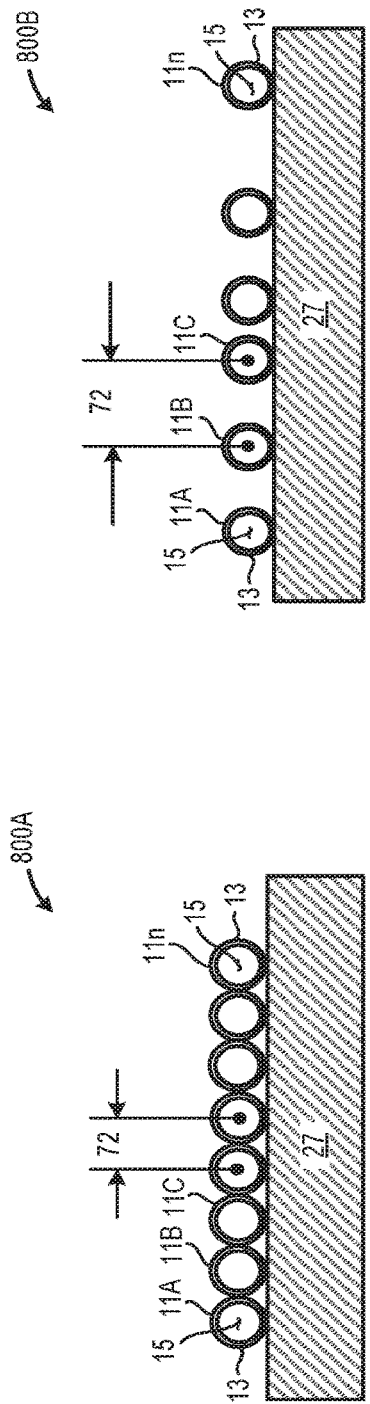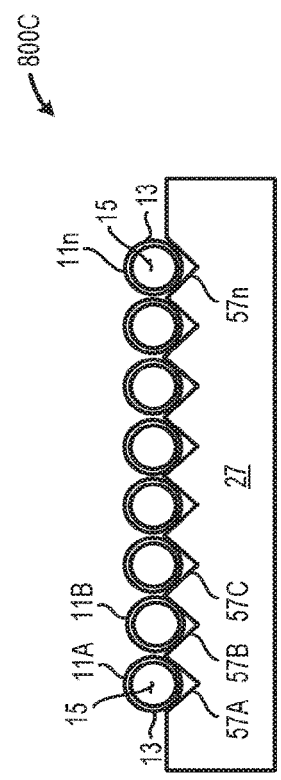

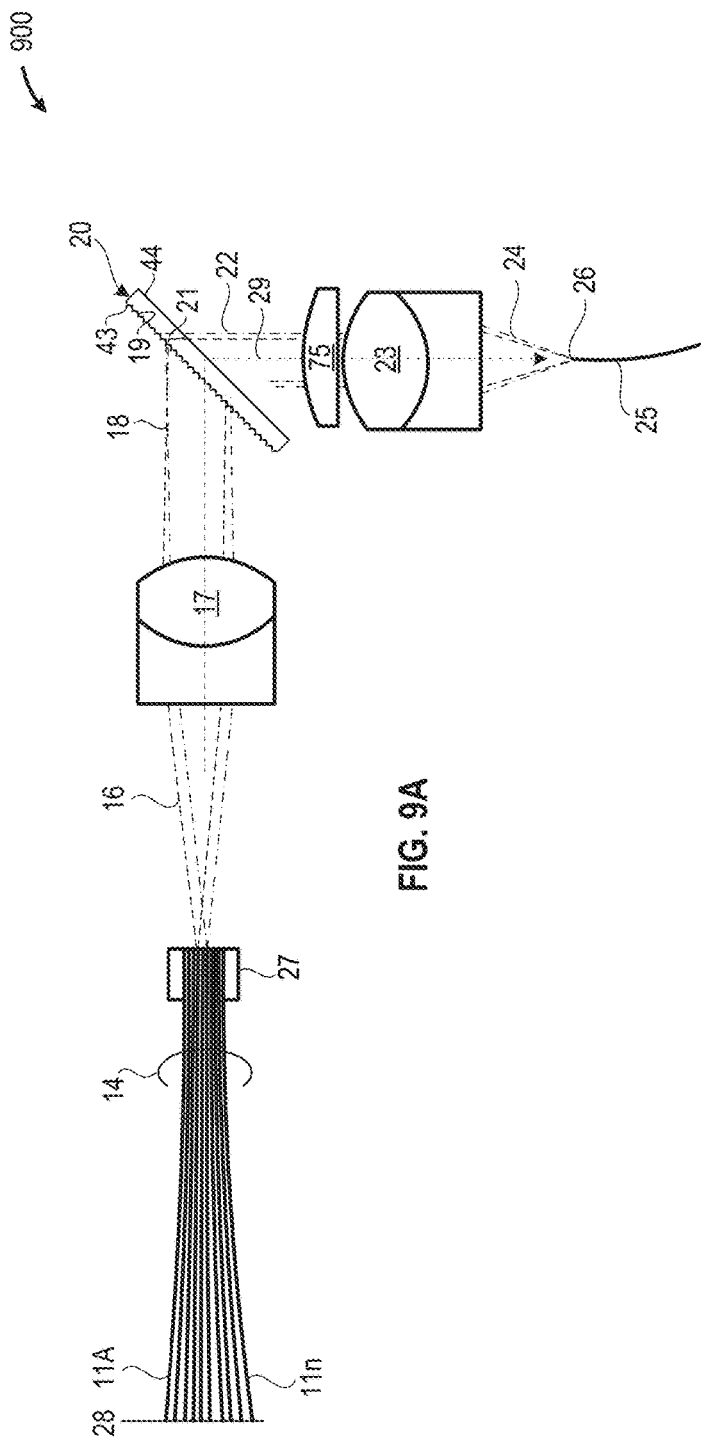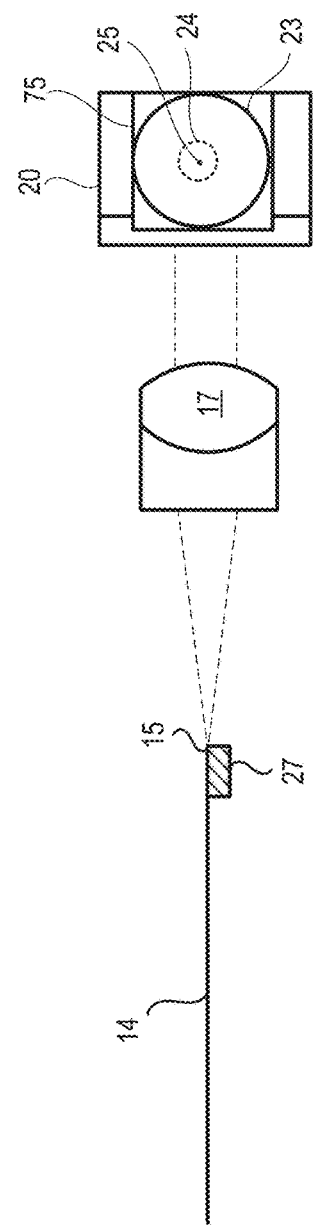
FIG. 9A
FIG. 9B

METHODS AND SYSTEMS FOR SPECTRAL BEAM-COMBINING

CROSS-REFERENCES TO RELATED APPLICATIONS

This application is a continuation of International Patent Application No. PCT/US2019/027238, filed on Apr. 12, 2019, entitled, "Methods and Systems for Spectral Beam Combining," which claims priority to U.S. Provisional Patent Application No. 62/698,020, filed on Jul. 14, 2018, the disclosures of which are hereby incorporated by reference in their entirety for all purposes.

BACKGROUND OF THE INVENTION

High-power industrial lasers may be used for multiple applications, for example, in metal-cutting, sintering, and welding applications. Those applications may require on the order of one kilo-watt or more of optical power with a beam that can be focused into a small spot. Often, techniques for such applications involve utilizing diode-pumped solid-state lasers or diode-pumped fiber lasers. While those techniques may achieve suitable power and brightness, a significant amount of heat may be wasted in the process of converting received pump diode-laser power to high-brightness output power from the diode-pumped lasers. Laser systems for such applications are typically large in size and are often costly due to the significant number of diode-pump components required to obtain a sufficient power level for a particular application such as metal-cutting, sintering, or welding.

BRIEF DESCRIPTION OF THE DRAWINGS

The accompanying drawings, which are included to provide a further understanding of the invention and are incorporated in and constitute a part of this specification, illustrate an embodiment of the invention and together with the description serve to explain the principles of the invention. In the drawings:

FIG. 1A is a plan view of an illustrative spectral beam combiner system that receives electromagnetic energy having a plurality of wavelengths via a plurality of optical fibers disposed in, on, or across a surface of a substrate member to provide a collimated electromagnetic energy output via an output fiber, in accordance with an embodiment of the present invention;

FIG. 1B is an elevation view of the illustrative spectral beam combiner system depicted in FIG. 1A, in accordance with an embodiment of the present invention;

FIG. 1C is a perspective view of an illustrative optical fiber contained in used in the illustrative laser system depicted in FIGS. 1A and 1B, in accordance with an embodiment of the present invention;

FIG. 4A is a schematic diagram of an illustrative system in which an electromagnetic energy source is positioned collinear with the central axis of the first optical element (e.g., a compound lens), in accordance with an embodiment of the present invention;

FIG. 4B is a schematic diagram of another illustrative system in which the electromagnetic source is positioned a small distance off the central axis of the first optical element (e.g., a compound lens), in accordance with an embodiment of the present invention;

FIG. 6A is a table that includes a plurality of system parameters, in accordance with an embodiment of the present invention;

FIG. 6B is a table that includes a set containing a plurality of wavelengths, in accordance with an embodiment of the present invention;

FIG. 7A is an image of a hypothetical model system that includes a 105 μm core-diameter fiber source with a 4 nm FWHM wide gaussian spectrum and in which a 105 μm diameter white circle (representing a perfectly imaged fiber) is superimposed, in accordance with an embodiment of the present invention;

FIG. 7B is an image of a hypothetical model system that includes a 105 μm core-diameter fiber source with a 0.3 nm FWHM wide gaussian spectrum and in which a 105 μm diameter white circle (representing a perfectly imaged fiber) is superimposed, in accordance with an embodiment of the present invention;

FIG. 7C is an image of a laboratory system that includes a 105 μm core-diameter fiber source with a 4 nm FWHM wide gaussian spectrum, in accordance with an embodiment of the present invention;

FIG. 7D is an image of a laboratory system that includes a 105 μm core-diameter fiber source with a 0.3 nm FWHM wide gaussian spectrum, in accordance an embodiment of the present invention;

FIG. 8A is a vertical cross section of an example system in which the plurality of optical fibers is disposed adjacent each other and proximate at least a portion of a surface of a flat or planar substrate (e.g., a mechanical or machined substrate), in accordance with an embodiment of the present invention;

FIG. 8B is a vertical cross section of another example system in which at least some of the plurality of optical fibers are spaced apart to allow small adjustments in position and/or location to compensate for wavelength errors in the electromagnetic energy produced by one or more electromagnetic energy output devices, in accordance with an embodiment of the present invention;

FIG. 8C is a vertical cross section of yet another example system in which a plurality of detents, channels, or similar grooves have been formed or otherwise disposed in the surface of the base or substrate such that each of at least some of the plurality of optical fibers are at least partially disposed within a respective groove to form a registered array, in accordance with an embodiment of the present invention;

FIG. 9A is a plan view of an illustrative spectral beam combiner system that includes a third optical element to provide a beam shaping capabilities to compensate for spectral broadening of the electromagnetic energy that is introduced or caused by the dispersion device or system, in accordance with an embodiment of the present invention;

FIG. 9B is an elevation view of the illustrative spectral beam combiner system depicted in FIG. 9A, in accordance with an embodiment of the present invention;

DETAILED DESCRIPTION OF THE INVENTION

Figure 2:
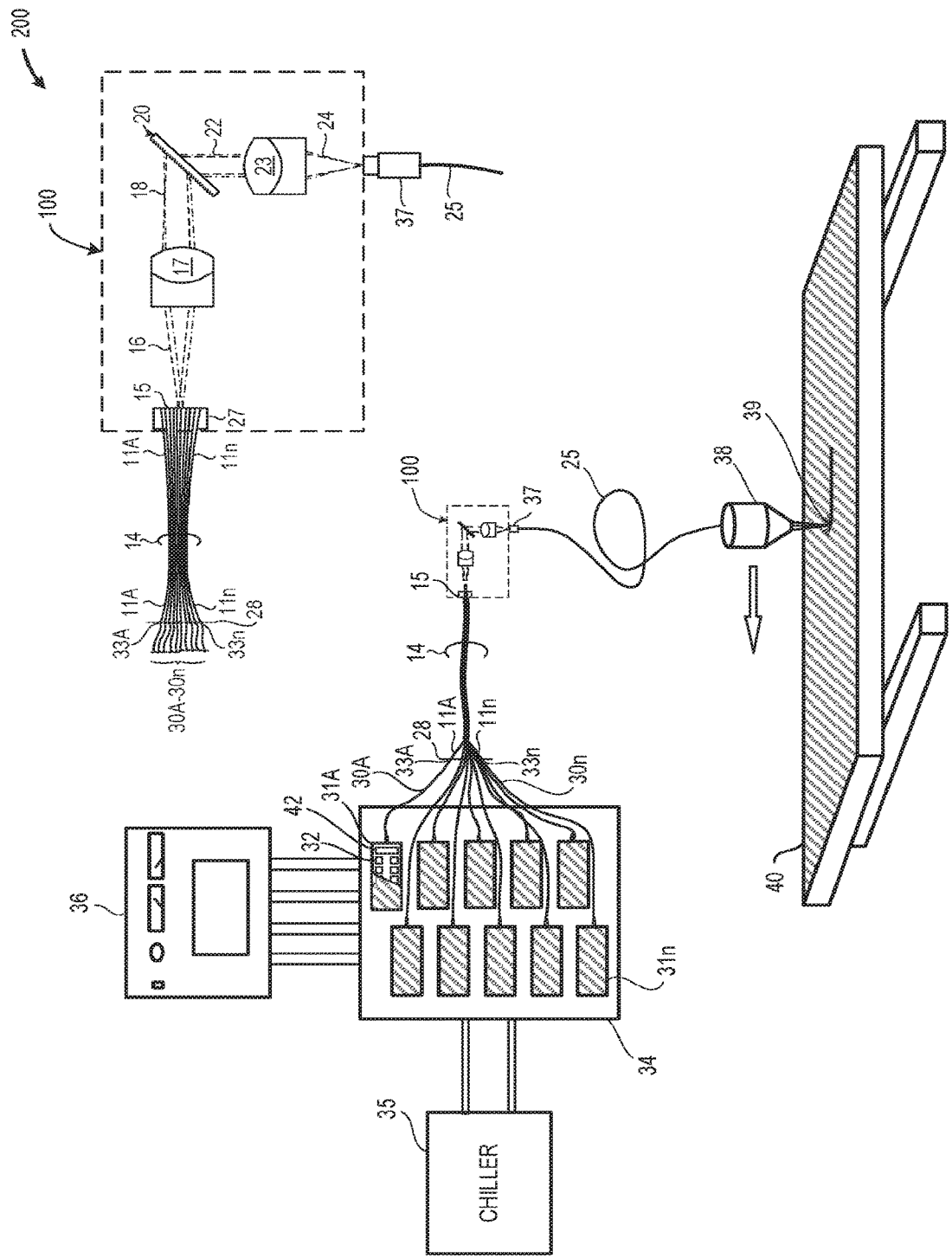
FIG. 2 is a schematic of an illustrative system that uses the spectral beam combiner system 100 to provide a relatively high-power electromagnetic energy output capable of removing material from (i.e., cut) a work piece, in accordance with an embodiment of the present invention.

As used herein the term "optical" refers to electromagnetic energy in any portion of the electromagnetic spectrum including, but not limited to, electromagnetic energy in all or a portion of one or more of: the human visible spectrum that includes electromagnetic energy having wavelengths from 400 nanometers (nm) to 790 nm; the ultraviolet (UV) spectrum that includes electromagnetic energy having wavelengths less than 400 nm; and/or the infrared (IR) spectrum that includes electromagnetic energy having wavelengths greater than 790 nm. Similarly, unless explicitly stated otherwise, elements, apparatuses, and/or components referred to as "optical" (e.g., an "optical element") should be understood as translucent or transparent to electromagnetic energy having wavelengths in the UV, visible, and/or IR spectrum such as a glass lens or a glass reflector or a glass transmission grating. Some optical elements do not transmit light such as a metal mirror or a metal grating or glass optic with a high-reflectivity coating. Another example of optical elements is curved mirrors that can perform the same imaging function as lenses.

The systems and methods disclosed herein make use of an optical fiber to receive focused, collimated, electromagnetic energy at a plurality of frequencies. Such beneficially and advantageously permits the generation of a relatively high-power electromagnetic energy output transmissible via an output fiber. The relatively high-power electromagnetic energy output is suitable for a wide variety of material removal, material fabrication, and material cutting operations.

FIG. 1A is a plan view of an illustrative fiber spectral beam combiner system 100 that receives electromagnetic energy having a plurality of wavelengths via a plurality of optical fibers 11A-11n (collectively, "optical fibers 11") that may be disposed in, on, or across a surface of a substrate member 27 to provide a collimated electromagnetic energy output via an output fiber 25, in accordance with an embodiment of the present invention. FIG. 1B is an elevation view of the illustrative spectral beam combiner system 100 depicted in FIG. 1A, in accordance with an embodiment of the present invention. FIG. 1C is a perspective view of an illustrative optical fiber 11 used in the illustrative laser system 10 depicted in FIGS. 1A and 1B, in accordance with an embodiment of the present invention. In embodiments of the present invention, some or all of the optical fibers 11 may each transmit electromagnetic energy at the same or different wavelengths. The spectral beam combiner system 100 collimates the electromagnetic energy transmitted via each of the optical fibers 11 to provide a relatively high power electromagnetic energy output via the output fiber 25.

As illustrated in FIGS. 1A and 1B, the electromagnetic energy received from the optical fibers 11 included in the fiber bundle 14, may be present at multiple wavelengths or frequencies. The received electromagnetic energy may be introduced to the optical fibers 11 using any number of electromagnetic energy sources, such as one or more laser diodes, fiber-coupled modules (FCMs), and/or similar sources of electromagnetic energy. The spectral beam combiner system 100 collimates the received, relatively low-power, electromagnetic energy to provide a single, relatively high-power, electromagnetic energy output focused on an output device or system, such as a small area or focal point 26 on the core(s) of an output fiber 25. In an embodiment of the present invention, the output fiber 25 may include at least one multimode output fiber that simultaneously propagates electromagnetic energy having a plurality of transmission modes or of varying wavelengths. In an embodiment of the present invention, the optical fibers 11 may be positioned before a first optical element 17 (e.g., a collimating lens) disposed in or along the optical axis or path 29 and/or along the optical axis of the incident electromagnetic energy. Although depicted as a cemented doublet lens in FIG. 1, other lenses such as air-space doublets, air-space triplets, or aspheric may be substituted in other embodiments, however due to the greater reflective losses in air-space lens systems (attributable to the greater number of lens surfaces), such lenses may have reduced efficiency over cemented lens systems. In an embodiment of the present invention, an electromagnetic energy dispersion device or system 20 (e.g., a grating such as a transmission grating) may be positioned between the first optical element 17 and a second optical element 23 (e.g., a lens such as a focusing lens) disposed in or along the optical path and/or along the optical axis of the electromagnetic energy exiting the dispersion device or system 20. In an embodiment of the present invention, each of the first optical device 17 and the second optical element 23 may be positioned transverse to an optical axis of the spectral beam combiner system 100.

FIG. 2 is a schematic of an illustrative metal cutting system 200 that uses the spectral beam combiner system 100 to provide a relatively high-power electromagnetic energy output capable of removing material from (i.e., cut) a work piece 40, in accordance with an embodiment of the present invention. In an embodiment of the present invention depicted in FIG. 2, each of the plurality of optical fibers 11A-11n receives electromagnetic energy from a respective electromagnetic energy output device 31A-31n (collectively, "electromagnetic energy output devices 31"). Some or all of the electromagnetic energy output devices 31 may provide relatively low power electromagnetic energy at the same or different wavelengths to respective ones of the optical fibers 11 included in the fiber bundle 14. In at least some embodiments, at least some of the electromagnetic energy output devices 31 include one or more laser sources capable of providing, generating, or otherwise emitting electromagnetic energy at a defined wavelength or within a defined wavelength band. In an embodiment of the present invention, an electromagnetic energy output device 31 may be, for example, a fiber-coupled light source such as a fiber-coupled module (FCM), a fiber-coupled laser diode module, or a single fiber-coupled laser. In an embodiment of the present invention, an electromagnetic energy output device 31 may be a single diode laser or the electromagnetic energy output device 31 may be a multiple-diode laser (e.g., an FCM that includes multiple diode lasers, for example, assembled inside of a single package or container). In an embodiment of the present invention, an electromagnetic radiation device 31 that is a single diode laser may be coupled to a single mode fiber (or a multimode fiber). In an embodiment of the present invention, an electromagnetic radiation device 31 that is a multiple-diode laser is coupled to a multimode fiber. In an embodiment of the present invention, the electromagnetic energy output device 31 (e.g., a fiber-coupled module) includes one or more laser devices (e.g., laser diode devices). In an embodiment of the present invention, the system 200 may include a plurality electromagnetic energy output devices 31, such as FCMs, each coupled to and providing an electromagnetic energy output to an optical fiber 11 included in the fiber bundle 14. In an embodiment of the present invention each electromagnetic energy output device 31 is individually coupled to a respective or corresponding optical fiber 11 in the fiber bundle 14, such that each electromagnetic energy output device 31 is coupled to a different one of the optical fibers 11 of the fiber bundle 14. In an embodiment of the present invention, each of the plurality of FCMs contains one or more diode lasers and/or diode laser chips and each of such diode lasers and/or diode laser chips may have a respective sub-mount. In an embodiment of the present invention, each optical fiber 11 carries electromagnetic energy produced, generated, or otherwise emitted by a respective one of the plurality of electromagnetic energy output devices 31. In an embodiment of the present invention, each optical fiber 11 carries electromagnetic energy at one or more wavelengths, for example, electromagnetic energy in the visible light band of the spectrum or electromagnetic energy in another one or bands of the electromagnetic spectrum that produces a suitable amount of energy (e.g., light and/or heat) for a desired system or application.

In an embodiment of the present invention, optical fibers 11A-11n included in the fiber bundle 14 provide electromagnetic energy to the collimating lens 17. In an embodiment of the present invention, an end 15 of each of the plurality of optical fibers 11 may be cleaved and/or polished. In an embodiment of the invention, the ends 15 of the optical fibers 11 may be disposed, positioned, or otherwise placed on a substrate member 27 such that they form a regularly spaced or irregularly spaced array of optical fibers 11. In an embodiment of the present invention, although not visible in FIG. 1, the substrate member 27 may include a plurality of generally parallel recesses and each of the plurality of recesses may receive a respective one of the plurality of optical fibers 11A-11n. For example, in an embodiment of the present invention, the plurality of optical fibers 11 may be disposed in a closely-spaced (for example, the optical fibers may be spaced about two microns apart) and defined, array that is, for example, formed, coupled, or positioned on a substrate member 27, such as a planar substrate member. In an embodiment of the present invention, an electromagnetic radiation device 31 may include a single diode laser. In an embodiment of the present invention, an electromagnetic radiation device 31 may be an FCM that includes a single diode laser.

As shown in FIG. 1C, each of the plurality of optical fibers 11 included in the fiber bundle 14 may have a core 12 at least partially surrounded by an outer cladding 13 disposed about the periphery of the core 12. The optical fiber 11 may also include a translucent or opaque jacket (not visible in FIG. 1C) disposed about all or a portion of the periphery of the outer cladding 13. In an embodiment of the present invention, the core 12 and/or the cladding 13 may be formed, at least in part, from glass (e.g., silicon dioxide, $SiO_2$). In an embodiment of the present invention, the core 12 and/or the cladding 13 may be formed, at least in part, from a mixture containing one or more types of polymers and/or glass. In an embodiment of the present invention, the core 12 and/or the cladding 13 may be formed from one or more polymers. In an embodiment of the present invention, electromagnetic energy, containing constituent or component electromagnetic energy in all or a portion of one or more of: the ultraviolet electromagnetic spectrum having wavelengths below about 400 nanometers (nm); the visible electromagnetic spectrum having wavelengths of from about 400 nm to about 790 nm; and/or the infrared electromagnetic spectrum having wavelengths above about 790 nm is confined to the core 12. In such embodiments, the index of refraction of the material forming the coating or cladding 13 is less than the index of refraction of the material forming the core 12. In an embodiment of the present invention, while not shown, each of the optical fibers 11 may be a commercially available fiber having an outer coating or jacket. Where such commercially available fibers include an outer coating or jacket, the jacket or outer coating may be stripped from the optical fiber for a distance extending from the end 15 of the optical fiber 11. For example, the optical fiber 11 may include a polymer outer coating that extends at least partially about the periphery of the cladding 13 along all or a portion of the length of each optical fiber 11 included in the fiber bundle 14.

The optical fibers 11 included in the fiber bundle 14 may have any cladding thickness and the thickness of the cladding may be, for example, about 10 microns thicker than the core diameter of the respective optical fiber 11. In a first non-limiting example, the optical fibers 11 included in the fiber bundle 14 may have a core diameter of 50 microns (µm) and a 125 µm cladding diameter. In another non-limiting example of an embodiment of the present invention, the optical fibers 11 included in the fiber bundle 14 may have a core diameter of 105 µm and a 125 µm cladding diameter. It should be understood by one of ordinary skill in the art that other core diameters and/or cladding diameters may be substituted.

In an embodiment of the present invention, a first end 33A-33n of each of the plurality of optical fibers 11A-11n included in the fiber bundle 14 may be coupled to a respective one of a plurality of electromagnetic energy output devices 31A-31n (e.g., a fiber-coupled light source, such as a fiber-coupled module) via fusion splicing or other connection method and/or device. In an embodiment of the present invention, a second end 15 of each of the plurality of optical fibers 11 included in the fiber bundle 14 forms a portion of the fiber array, and may be disposed on the surface of a substrate member 27 and may transport, transmit, or otherwise convey at least a portion of the electromagnetic energy provided or otherwise generated by each of the electromagnetic energy output devices 31 to a collimating device 17, for example, a collimating lens. In an embodiment of the present invention, the energy output from the electromagnetic energy output devices 31 is optically coupled to a collimating device 17, for example, a collimating lens.

A system 200, in accordance with the present invention, may include a plurality of electromagnetic energy output devices 31A-31n, such as a plurality of FCMs, each of which is optically coupled to A respective one of the plurality of device output fibers 30A-30n. In an embodiment of the present invention, each of the electromagnetic energy output devices 31A-31n may include, be coupled to (e.g., physically or optically coupled), or be integrated with, a device output fiber 30A-30n. In an embodiment of the present invention, a device output fiber 30 may be fusion spliced, or otherwise coupled to an optical fiber 11. In an embodiment of the present invention, a device fiber 30 is an optical fiber 11 (i.e., the output device fiber 30 and optical fiber 11 may be one and the same).

In an embodiment of the present invention, electromagnetic energy output devices 31A-31n may include an electromagnetic energy source 32, such as a diode laser, within the respective electromagnetic energy output device 31.

In an embodiment of the present invention, when an electromagnetic radiation output device 31 (e.g., an FCM), includes multiple electromagnetic energy sources 32A-32n (e.g., multiple diode lasers 32A-32n), the optical fiber 11 is a multimode fiber. In an embodiment of the present invention, when an electromagnetic radiation output device 31 is a device that outputs electromagnetic energy of only one mode, optical fiber 11 is a single mode fiber.

In an embodiment of the present invention, the output fiber 30 from each of the electromagnetic energy output devices 31 may be optically coupled, for example via fusion splicing, to a respective one of the optical fibers 11A-11n. Fusion splicing involves fusing of two fiber ends together such that there is minimal, or ideally no, electromagnetic discontinuity as an optical signal passes through the joint between the optical fibers. Fusion splicing beneficially provides system assemblers the ability to repair and/or replace an inoperable or malfunctioning electromagnetic energy output device 31 without affecting the electromagnetic output of the remaining electromagnetic energy output devices 31. In an embodiment of the present invention, the electromagnetic energy that exits each of the plurality of optical fibers 11A-11n diverges in some angular distribution 16. In an embodiment of the present invention, an optical fiber 11 may be characterized by the diameter of the core 12 and its corresponding numerical aperture. The numerical aperture of an optical fiber 11 is approximately equal to the half-angle of the divergence expressed in radian units. In an embodiment of the present invention, an optical fiber 11 may, for example, have a core diameter of or approximately of 0.105 mm and a numerical aperture of or approximately of 0.15. A core 12 with a diameter, for example, as large as the 0.105 mm example may support a plurality of electromagnetic transmission modes. A fiber that supports a plurality of electromagnetic transmission modes may be referred to as a "multimode" fiber. Multimode optical fibers are to be distinguished from "single-mode" optical fibers which may have a smaller core size (e.g., 0.01 mm) and which can only support a single optical mode.

In an embodiment of the present invention, a spectral beam combiner system 100 may be partially or completely disposed in an enclosure or package.

In an embodiment of a system 100, 200, in accordance with the present invention, a plurality of optical fibers 11 are multimode fibers, and are optically coupled to the first optical device 17, and the first optical device 17 receives a plurality of electromagnetic energy inputs via the plurality fibers 11 (which in this example are multimode fibers).

In an embodiment of a system 100, 200, in accordance with the present invention, a first one of the plurality of optical fibers 11 is a multimode fiber, in this example, that is coupled, via a device output fiber 30, to a first electromagnetic energy output device 31, such as a fiber coupled module, and a second one of the plurality of optical fibers 11 is a multimode fiber, that is coupled, via a device output fiber 30, to a second electromagnetic radiation energy output device 31, such as a fiber coupled module. In an embodiment of the present invention, an electromagnetic radiation device 31 may include the electromagnetic radiation device 31 and the device output fiber 30.

In an embodiment of a system 100, 200, in accordance with the present invention, a plurality of optical fibers 11 are a plurality of single mode fibers optically that are optically coupled to the first optical device 17, and the first optical device receives the plurality of electromagnetic energy inputs via the plurality of optical fibers 11 that are single mode fibers. In an embodiment of a system 100,200, in accordance with the present invention, a first one of the plurality of optical fibers 11 (which is a single mode fiber, in this example) is coupled to an electromagnetic radiation energy output device 31 that is a diode laser 32A, and a second one of plurality of optical fibers 11 (which is a single mode fiber, in this example) is coupled to a second diode laser 32B.

In an embodiment of the present invention, the second end 33A-33n of some or all of the plurality of optical fibers 11A-11n may each be coupled to respective electromagnetic energy output device 31A-31nIn an embodiment of the present invention, an electromagnetic energy output device 31A-31n may be a wavelength stabilized electromagnetic energy output device. In an embodiment of the present invention, the electromagnetic energy exiting each of the plurality of optical fibers 11A-11n may be collimated using the first optical element 17 (e.g., a collimating lens positioned one focal length away from the fiber ends). In an embodiment of the present invention, a dispersion device or system 20 (e.g., a grating) may be utilized to diffract all or a portion of the electromagnetic energy exiting the first optical element 17. In an embodiment of the present invention, the dispersion device or system 20 may diffract received electromagnetic energy at some angular direction. For example, in the embodiment depicted in FIG. 1 there is a transmission grating 20 that diffracts the received electromagnetic energy at an angle (e.g., a 90° angle as shown) towards the second optical device 23 (e.g., a focusing lens). In an embodiment of the present invention, the dispersion device or system 20 produces, generates, and/or outputs one or more collimated beams of electromagnetic energy.

In an embodiment of the present invention, each of the one or more collimated beams of electromagnetic energy are diffracted into a common angular direction 22 that may be focused 24 by the second optical element 23 into a small area or region, for example a focal point 26 on the end of output fiber 25. In an embodiment of the present invention, the second optical element 23 may include one or more lenses, such as one or more combining lenses and/or one or more focusing lenses. In an embodiment of the present invention, a dispersion device or system 20, in accordance with the present invention, may include an optical element having a first surface 19 and a second surface 21, In an embodiment of the present invention, a finish 43 (e.g., a sub-micron periodic corrugation on one surface) that diffracts at least a portion of the electromagnetic energy incident upon the first surface 19 may be disposed on, across, about, or integrated into or with the dispersion device or system 20 or at least a portion of the dispersion device or system 20. In an embodiment of the present invention, the second surface 21 may be coated with a substance or finish 44 (e.g., an anti-reflection (AR) coating) (not shown) that may be disposed on, across, about, or integrated into all or at least a portion of the dispersion device or system 20. In an embodiment of the present invention, the dispersion device or system 20 is at least one of a diffraction grating, a transmission grating, or a reflection grating. In an embodiment of the present invention, the dispersion device or system diffracts, transmits, and/or reflects electromagnetic energy received.

In an embodiment of the present invention, electromagnetic energy may be focused at one or more focal points 26, for example, at one or more focal points 26 on an output fiber 25. In an embodiment of the present invention, the electromagnetic output of the output fiber 25 is greater than the electromagnetic output of each of the plurality of optical fibers 11A-11n by a factor of or approximately a factor of the number optical fibers included in the plurality of optical fibers 11A-11n. The substantially greater electromagnetic output beneficially enables high power (e.g., kilowatt) applications such as metal cutting as shown in FIG. 2. The output fiber 25 may include, for example, any number and/or combination of step-index optical fibers and/or graded-index optical fibers. In an embodiment of the present invention, an output fiber 25 may include a multimode optical fiber or may be a multimode optical fiber.

As shown in FIG. 2, in an embodiment of the present invention, the spectral beam combiner system 100 may be used to increase the energy or power output of a material removal system, such as a metal cutting system 200, in accordance with the present invention, that is depicted in FIG. 2. In an embodiment of the present invention, each of the plurality of electromagnetic energy output devices 31A-31n may be optically coupled, for example via fusion splicing of an output fiber 30A-30n (associated with an electromagnetic energy output devices 31A-31n) to a respective one of the optical fibers 11A-11n, at connection point 28 (i.e., a location where an end of a device output fiber 30 is joined, coupled, or integrated with optical fiber 11. In an embodiment of the present invention, an output fiber 30A-30n extends from each respective one of the electromagnetic energy output devices 31A-31n. In an embodiment of the present invention, each electromagnetic energy output optical fiber 30A-30n may be cut to a defined or desired length, may have a portion of its jacket stripped when a commercially available fiber having a jacket is utilized as an output optical fiber 30A-30n, may have an end of the output fiber 30A-30n cleaved to a desired length, and the may be spliced to an end 33A-33n of a respective or corresponding one of the plurality of optical fibers 11A-11n.

As depicted in FIG. 2, the output fiber 25 may optically couple the spectral beam combiner system 100 to a focusing device 38, such as a focusing lens. In an embodiment of the present invention, the electromagnetic output from the focusing lens 38 may be utilized to remove material from a surface of a work piece 40 by focusing the electromagnetic output from the focusing lens on a small area or focal point 39 on the surface of the work piece 40.

The example of a system 200 depicted in FIG. 2 includes a total of ten (10) electromagnetic energy output devices 31. The power of the system 200 is scalable in proportion to the number of electromagnetic energy output devices 31 (e.g., laser devices, such as fiber-coupled modules FCMs). The system may have a greater or lesser number of electromagnetic energy output devices 31 than depicted in FIG. 2. For example, ten fiber sources (i.e., ten electromagnetic energy output devices 31) at 200 watts output power each would provide 2000 watts (2 kW) on a small area or focal point 39 on the surface of the work piece 40. This energy output is sufficient to cut a moderately-thick metal work piece 40 at a practical feed rate. In an embodiment of the present invention, the system 200 may include one or more power supplies 36. Independent of the number of electromagnetic output devices 31 (e.g., laser output devices such as fiber-coupled modules) utilized, a spectral beam combiner 100 may be utilized in a system 200 in accordance with the present invention. As the invention may be practiced with the spectral beam combiner system 100, a system 200 in accordance with the present invention beneficially minimizes the number of components needed as compared to more complicated fiber-laser or solid-state laser systems.

In an embodiment of the present invention, as shown in FIG. 2, each of the plurality of optical fibers 11A-11n is coupled to a respective one of a plurality of electromagnetic energy output devices 31 (e.g., wavelength-stabilized diode-laser sources). The electromagnetic energy transmitted by each of the optical fibers 11 is collimated 18 (i.e., rays are made parallel) using a first optical element 17 (e.g., a collimating device or lens), and each wavelength of energy (e.g., light) in the electromagnetic energy exiting each of the optical fibers 11 collimates at a slightly different angle. In an embodiment of the present invention, the electromagnetic wavelengths carried by each of the optical fibers 11A-11n may be pre-selected and/or pre-determined such that all of the electromagnetic energy exiting (i.e., emitted from, transmitted from, or outputted from) the first optical element 17 collimates at a single angle 22 after they diffract off the dispersion device or system 20 (e.g., grating). A second optical element 23 (e.g., a second lens) focuses (and emits, transmits, or outputs) the collimated, combined, electromagnetic energy at least at a single location or spot 26 at the end of the fiber 25.

In an embodiment of the present invention, some or all of the electromagnetic energy output devices 31 may be disposed in thermal contact with and/or thermally coupled to a cooling plate 34. The cooling plate 34 removes and/or dissipates heat generated or emitted by the electromagnetic energy output devices 31. In an embodiment of the present invention, one or more coolants, cooling fluids, or cooling gases may be circulated between a chiller 35 and the cooling plate 34. In an embodiment of the present invention, the output fiber 25 and/or focusing lens 38 may include input couplers 37 that are specifically designed to handle the high power generated by the electromagnetic energy output devices 31 without optically damaging the core of the output fiber 25. In an embodiment of the present invention, an anti-reflection coating may be disposed on, about, or across all or a portion of the surface of one or both ends of the output fiber 25.

In an embodiment of the present invention, at least a portion of the plurality of electromagnetic energy output devices 31 may include one or more fiber-coupled modules (FCMs). For example, fiber-coupled modules useful as electromagnetic energy output devices 31 are produced by companies such as Lumentum, nLight, and II-VI. A plurality of individual electromagnetic sources capable of producing an electromagnetic energy output may be disposed at least partially within each electromagnetic energy output device 31. In an embodiment of the present invention, the electromagnetic energy output devices 31 may include but are not limited to a plurality of diode lasers, each capable of producing an electromagnetic energy output at one or more defined wavelengths or within a defined wavelength band. Each of the electromagnetic energy output devices 31, such as an FCM, may be specified to provide or produce an electromagnetic energy output at a pre-selected wavelength.

The nominal wavelength of diode lasers in an electromagnetic energy output device 31 such as an FCM may be determined by the composition of the quantum-well layer during the epitaxial growth of the semiconductor crystal, such as the fraction of indium in an $In_xGa_{1-x}As$ quantum well. Furthermore, there are well-known optical techniques for locking and narrowing the output spectrum of diode lasers, including the use of an etched grating that is embedded inside the diode (called a DFB laser) or using volume-Bragg gratings within the internal coupling optics of the FCM. In at least one example, a plurality of diodes, each providing an electromagnetic energy output may be optically coupled to a single passive, optical fiber 11. As examples, an optical fiber 11, in accordance with the present invention, may have a 105 micrometer (μm) core diameter and 0.15 numerical aperture (NA) or a 200 μm core and 0.22 NA. In an embodiment of the present invention, an electromagnetic radiation output device 31 may be an FCM, that contains at least two devices 32A, 32B (e.g., diode lasers). For example, in an embodiment of the present invention, an electromagnetic radiation output device 31 may be an FCM that contains, for example eight devices 32A-32H, for example eight high-power diodes, that are packed or positioned inside of the FCM, and that generate electromagnetic energy that is coupled into or optically coupled to a single optical fiber 11,30. In an embodiment of the present invention, when the an electromagnetic radiation output device 31 (e.g., an FCM), includes multiple electromagnetic energy radiation devices 32A-32n (e.g., multiple diode lasers), the optical fiber 11,30 is a multimode fiber. For a desired power output of an electromagnetic energy output device 31, such as an FCM, the number of devices 32A-32n (e.g., diode lasers) within an electromagnetic energy output device 31, such as an FCM, may be determined by the beam parameter product (BPP) of the optical fiber 11,30 and the output-beam characteristics of the individual electromagnetic energy output devices 31, for example high-power diodes in the FCMs. In an embodiment of the present invention, an extra factor of two may be obtained by taking advantage of the high degree of polarization in diode lasers and combining two beams at a polarizing-cube beam splitter within the electromagnetic energy output device 31 for a total of 16 diodes in the example. In an embodiment of the present invention, as many as 18 diodes or diode lasers may be combined to provide a total output power of around 200 W. Electromagnetic energy output devices 31, e.g., FCMs, in accordance with the present invention, may be assembled using millimeter scale lenses and mirrors. As disclosed herein the electromagnetic energy output devices 31 may be, for example and may weigh about 1-2 pounds and may be on the order of four inches on a side. An electromagnetic output device 31, in accordance with the present invention, such as an FCM, may produce, for example, 200 W power with a BPP of approximately 6 mm-mrad.

In an embodiment of the present invention, an electromagnetic energy output device 31, such as an FCM, may include volume-Bragg gratings (VBG) in its internal optics that can lock the lasers within the electromagnetic energy output device 31 to a single wavelength. Volume-Bragg gratings are at least partially transparent, and diffract a small amount of light back into the laser within a narrow spectral band. This feedback makes the diode laser have an output spectrum as narrow as 0.3 nm full-width, half-maximum (FWHM). See for example: C. Moser, F. Havermeyer, "Compact self-aligned external cavity lasers using volume gratings" Proc. SPIE, vol. 7194, 2009. VBGs, in accordance with the present invention, may be made from glass, and are insensitive to temperature variations.

In an embodiment of the present invention, some or all of the electromagnetic energy output devices 31, may alternatively be wavelength stabilized by embedding a grating or similar wavelength stabilization device or system 42 inside the semiconductor that constitutes the electromagnetic energy output devices 31, for example, as part of a wafer-level manufacturing process. Such wavelength stabilized electromagnetic energy output devices 31 may be referred to as having or featuring an "embedded grating".

Figure 3:
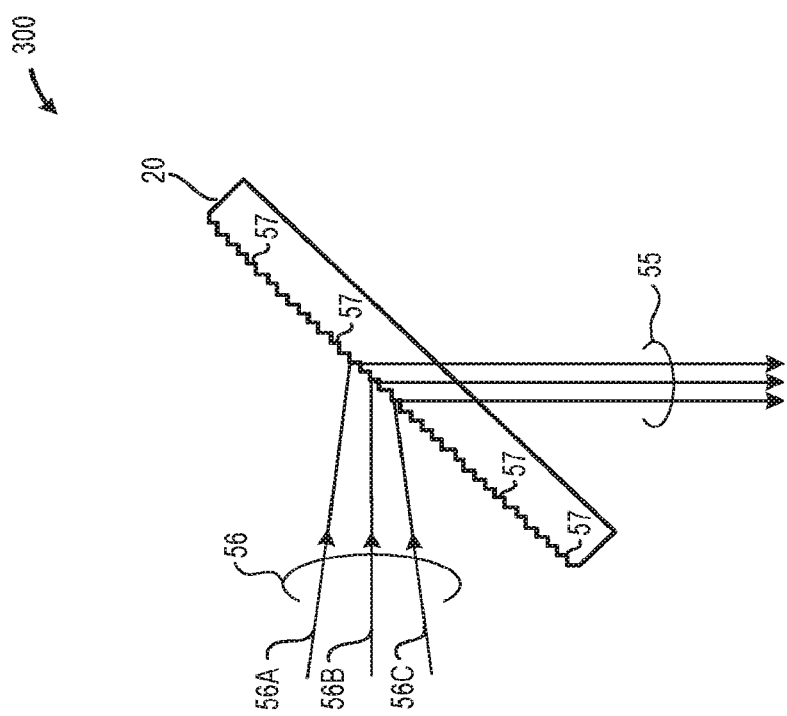
FIG. 3 is a schematic view of an illustrative system in which incident electromagnetic energy includes a plurality of electromagnetic energy wavelengths falling incident on a dispersion device or system, such as a transmission grating, in accordance with an embodiment of the present invention.

FIG. 3 is a schematic view of an illustrative system 300 in which incident electromagnetic energy 56 includes a plurality of electromagnetic energy wavelengths falling incident on the dispersion device or system 20, in accordance with an embodiment described herein. In embodiments, the dispersion device or system 20 may include a transmission grating, such as depicted in FIG. 3. In an embodiment of the present invention, the dispersion device or system 20 depicted in FIG. 3 may diffracts at least a portion 55 of the incident electromagnetic energy 56. The angle of diffraction of the incident electromagnetic energy 56 depends on physical parameters of the dispersion device or system 20, such as the pitch or spacing between grating grooves 57, the wavelength(s) of the incident electromagnetic energy 56, and the angle of incidence of the incident electromagnetic energy 56. In an embodiment of the present invention, the quantity of incident electromagnetic energy reflected, transmitted, and/or diffracted by a diffraction grating may be a function of the wavelengths and/or polarization of the incident electromagnetic energy 56. For example, the physical structure and/or composition of the dispersion device or system 20 may preferentially diffract a portion of the incident electromagnetic energy 56 while reflecting the remaining portion of the incident electromagnetic energy 56. In an embodiment, the diffraction grating 20 depicted in FIG. 3 may preferentially diffract incident electromagnetic energy 56 having wavelengths in at least one of: the visible electromagnetic spectrum extending from 300 nm to 790 nm and/or the near infrared electromagnetic spectrum extending from 790 nm to about 1200 nm. In embodiments, within a defined electromagnetic spectrum, the diffraction grating 20 may diffract, for example: about 90+% of the incident electromagnetic energy 56; about 93+% of the incident electromagnetic energy 56; about 95+% of the incident electromagnetic energy 56; about 97+% of the incident electromagnetic energy 56; about 99+% of the incident electromagnetic energy 56; about 99.5% of the incident electromagnetic energy 56; or about 99.9+% of the incident electromagnetic energy 56.

In an embodiment of the present invention, the dispersion device or system 20 may have only one diffraction order. In an embodiment of the present invention, the dispersion device or system 20 may include one or more commercially-available transmission gratings, such as a transmission grating manufactured by LightSmyth® Technologies, Inc. In an embodiment of the present invention, the dispersion device or system 20 may be positioned at or near a forty-five (45) degree angle of incidence with respect to the optical axis 29 and diffracting, for example, approximately 95% of the incident electromagnetic energy including electromagnetic energy having a mixed polarization. In an embodiment of the present invention, the angle of incidence of the incident electromagnetic energy may vary, for example, be greater or less than 45 degrees. The near independence of the efficiency to polarization is important as the polarization of light in an optical fiber gets scrambled after propagating a short distance down the fiber. Gratings from LightSmyth® have, for example, approximately 100 nm usable spectral range over which they are efficient. In an embodiment of the present invention, the dispersion device or system 20, may be fabricated from, for example, pure fused-silica or glass (i.e., a material that has a very high optical-damage threshold) or a plastic when suitable for a particular application.

As depicted in FIG. 3, the dispersion device or system 20 may include a transmission grating that includes one or more materials at least partially transparent to the electromagnetic energy produced by the electromagnetic energy output devices 31. The dispersion device or system/transmission grating 20 diffracts each wavelength component of the incident electromagnetic energy 56A, 56B, and 56C at a different angle. Although each of the incident electromagnetic waves 56A, 56B, and 56C fall incident at different angles measured with respect to the surface of the dispersion device or system/transmission grating 20 and the optical parameters of the dispersion device or system/transmission grating 20 produce a collimated electromagnetic output in which the electromagnetic waves 55 are substantially parallel. From the principles of optics, we know that if the directions of propagation 55, 56 in FIG. 3 are reversed in direction, the ray angles remain unchanged. In an embodiment of the present invention, as depicted in FIG. 1, electromagnetic energy at a defined set of wavelengths having different angles of incidence 18 on the dispersion device or system/transmission grating 20 can be pre-selected such that they all diffract into the same direction 22. In other words, the dispersion device or system/transmission grating 20 may be used to receive incident electromagnetic energy that includes different wavelengths, each at different angles of incidence to produce a collimated electromagnetic energy output having different wavelengths.

FIG. 4A is a schematic diagram of an illustrative system or device 400A in which an electromagnetic energy source 60 is positioned or transmitted collinear with the central axis 59 of the first optical element 17 (e.g., a compound lens), in accordance with an embodiment of the present invention. As depicted in FIG. 4A, the incident electromagnetic energy is collimated 61 when the first optical element 17 is positioned one focal length away from the source 60.

FIG. 4B is a schematic diagram of another illustrative system 400B in which the electromagnetic source 62 is positioned offset from the central axis 59 of the first optical element 17 (e.g., a compound lens), in accordance with an embodiment of the present invention. When the electromagnetic source 62 is positioned off the central axis 59 of the first optical element, the electromagnetic output from the first optical element 17 remains collimated 63 but at an angle with respect to the central axis 59.

Similarly, the electromagnetic energy emitted from the ends 15 of a set of side-by-side optical fibers 11 will diffract in different directions dependent upon the position and/or location of the end 15 of each of a respective optical fiber 11 with respect to the first optical device 17. In an embodiment of the present invention, the wavelengths of the electromagnetic energy emitted from the end 15 of each of the optical fibers 11 may be selected and/or predetermined (or predefined), such that the electromagnetic energy is diffracted in a defined or desired direction or at a defined or desired angle. In an embodiment of the present invention, the electromagnetic energy may be made to diffract into a same direction off a dispersion device or system 20, as illustrated in FIG. 1A. Thus, a benefit of the invention is the preselection or predetermination of the wavelength(s) of the electromagnetic energy output emitted from the end 15 of each of the optical fibers 11 such that the optical configuration depicted in FIGS. 1A and 1B produces, for example, a single focus spot 26 having electromagnetic energy that includes a plurality of wavelengths at the focal point 26 on the end of the output fiber 25. In an embodiment of the present invention, the first optical element 17 may include a cemented doublet lens. However, it would be understood by one of ordinary skill in the art that another type of first optical element 17 may be utilized to achieve the same collimation of incident electromagnetic energy emitted from the ends 15 of the optical fibers 11. For example, in an embodiment of the present invention, the first optical element 17 may include an air-spaced doublet, air-spaced triplet, or an aspheric lens.

There are many variations of embodiments of the present invention that include one or more of the features described herein. For example, in an embodiment of the present invention, a dispersion device or system 20 may include a reflection grating. However, reflection gratings tend to have poor efficiency in one polarization. In an embodiment of the present invention, a dispersion device or system 20 may include a transmission grating. In an embodiment of the present invention, for example, a transmission grating is positioned at or near 45-degree angle of incidence with respect to the optical axis 29, and is utilized to give or transmit a diffracted beam with the same diameter as the input beam to the dispersion device or system 20. In an embodiment of the present invention, a prism could be used instead of a grating for a dispersion device or system 20.

In an embodiment of the present invention, an optics model as described below, may be used to determine approximate specifications/parameters for a spectral beam combiner system 100. For example, in an optics model, such as described below, the dispersion device or system 20 may be oriented at exactly 45 degrees with respect to the optical axis 29. However, in an actual spectral beam combiner system 100 in accordance with the present invention, the dispersion device or system 20, for example a grating, may provide optimum efficiency when oriented at slightly above or below the 45 degrees (for example, deviate, by plus or minus approximately one and one-half degrees). Also, in the optics model described below, both the first optical element 17 and the second optical element 23 may be treated as ideal lenses. However, actual optical elements, such as lenses, may have non-constant focal length versus wavelength characteristics and may not form perfect images, such as would be formed by a computer generated optics model, due to inherent aberrations in the optical element. In an embodiment of the present invention, a dispersion device or system 20 may be a grating that diffracts at least a portion of the incident collimated electromagnetic energy at an angle near 90 degrees, and may have diffraction with a maximum range of from, about, and including 45 degrees to 135 degrees.

Multiple optical models may be utilized to design or emulate a spectral beam combiner system 100, in accordance with the present invention. A first-approximation optical model may be employed to illustrate the design of such a system in accordance with the present invention. With the dispersion device or system 20 (e.g., a diffraction grating) 20 positioned at a 45 degree angle to the optical axis 29, the grating pitch Λ (i.e., the spacing between the grating corrugations) that gives 90-degree deflection in FIG. 1 occurs when:

$$\Lambda = \lambda_0/\sqrt{2} \tag{1}$$

where $\lambda_0$ is the wavelength of the center (on-axis) fiber.

Using the idealized-optics approximations one can derive a simple formula for the shift in wavelength $\Delta\lambda$ corresponding to a sideways displacement of a fiber $\Delta x$ such that the image stays centered on the focal point 26 on the core of the output fiber 25:

$$\frac{\Delta\lambda}{\Delta x} = \frac{\lambda_0}{2F} \qquad (2)$$

where F is the focal length of the first optical element 17 and $\lambda_0$ is the wavelength for the fiber that lies on the central axis 59 of the first optical element 17 (i.e., the center fiber). Given the number of fibers N, the wavelength spacing $\Delta\lambda$ between the fibers that fits into the usable spectral range of the grating B (nominally 100 nm) is given by $$\Delta\lambda = B/(N-1) \qquad (3)$$

Let D be the spacing between fiber centers. The lens focal length F that fits the spectral output of all the fibers within the spectral range of the grating B is given by $$F = D\lambda_0/(2\Delta\lambda) \qquad (4)$$

The formulas (1) through (4) above may be applied to determine approximate parameters of a spectral beam combiner system 100 in accordance with the present invention, and to assign wavelengths to each of at least a portion of the plurality of the optical fibers 11 included in the fiber bundle 14.

Figure 5:
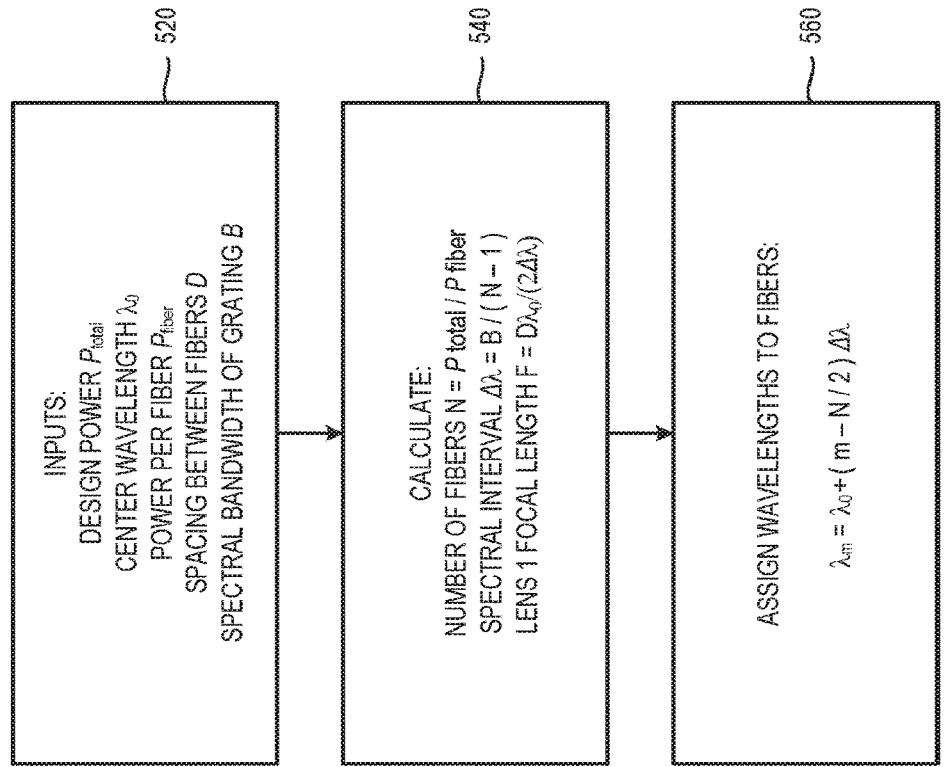
FIG. 5 is a high-level flow diagram that depicts an illustrative method for determining one or more spectral beam combiner system parameters, in accordance with an embodiment of the present invention.

FIG. 5 is a high-level flow diagram of an illustrative method 500 for approximating system parameters for the spectral beam combiner system 100, in accordance with an embodiment of the present invention. At 520, the method may receive the desired total output power $P_{total}$, the desired center wavelength $\lambda_0$, the available power per fiber from the fiber-coupled modules $P_{fiber}$, the desired spacing between fibers D, and/or and the spectral range over which the grating is efficient B.

At 540, the number of fibers may be calculated or determined according to:

$$N = P_{total}/P_{fiber} \qquad (5)$$

the spectral interval may be calculated or determined according to:

$$\Delta\lambda = B/(N-1) \qquad (6)$$

and/or the first optical element (i.e., lens) 17 focal length may be calculated or determined according to:

$$F = D\lambda_0/(2\Delta\lambda) \qquad (7)$$

At 560, the wavelength to assign to an optical fiber 11,30 having an index "m" and included in a plurality of "N" the optical fibers 11 in the fiber bundle 14 may be determined or calculated according to:

$$\lambda_m = \lambda_0 + (m - N/2)\Delta\lambda \qquad (8)$$

FIG. 6A is a table 600A that includes a plurality of system parameters for an example spectral beam combiner system 100, in accordance with an embodiment of the present invention. FIG. 6B is a table 600B that includes a set containing a plurality of wavelengths, each assigned to a respective optical fiber 11,30 as referenced in FIG. 6A, above, in accordance with at least one embodiment described herein. FIGS. 6A and 6B together provide an illustrative example of the determination of wavelength assignments for a spectral beam combiner system 100 that includes a total of 10 electromagnetic energy output devices 31A-31J, each providing an electromagnetic output at a wavelength per FIG. 6B to a respective optical fiber 11A-11J, in accordance with the present invention. The wavelength assignments included in FIGS. 6A and 6B are based on one or more of the desired inputs and calculations that were described with reference to FIG. 5. Illustrative parameter values for an example of a spectral beam combiner system 100, in accordance with the present invention, are listed in FIG. 6A and an illustrative set of wavelengths is listed in FIG. 6B.

FIGS. 7A-7D illustrate the advantage of having a narrow spectral bandwidth input to a spectral beam combiner system 100 in accordance with the present invention, using an exemplary individual fiber coupled module (i.e., a single fiber and not an array of fibers). FIGS. 7A and 7B represent images generated from a computer model simulation of a system 100 in accordance with the present invention, and FIGS. 7C and 7D illustrate images generated from actual operation of a spectral beam combiner system 100, in accordance with the present invention, in a laboratory. As shown in FIGS. 7A and 7C, when a broadband source is utilized, the electromagnetic energy, for example, light, does not adequately couple to an output, for example, an output fiber 26. FIGS. 7B and 7D illustrate images generated when an input source is spectrally stabilized, as more of the electromagnetic energy, for example, light couples to an exemplary output, for example an output fiber 25 (i.e., the output significantly mirrors the input). FIGS. 8A, 8B, and 8C illustrate various methods and devices for arranging the optical fibers 11A-11n included in a fiber bundle 14 to provide a fiber array to provide an electromagnetic energy input to the spectral beam combiner system 100. FIG. 8A is a vertical cross section of an example system 800A in which the plurality of optical fibers 11A-11n are disposed adjacent each other and proximate at least a portion of a surface of a flat or planar substrate 27 (e.g., a polished-silicon substrate), in accordance with an embodiment of the present invention. In an embodiment of the present invention, such as system 800A depicted in FIG. 8A, the center-to-center spacing 72 of the optical fibers 11 is determined, at least in part, by the outside diameter of the cladding 13. The packed-array approach depicted FIG. 8A maximizes use of the available spectral range of the dispersion device or system 20.

FIG. 8B is a vertical cross section of another example system 800B in which at least some of the plurality of optical fibers 11 are spaced apart to allow small adjustments in position and/or location to compensate for wavelength errors in the electromagnetic energy produced by one or more electromagnetic energy output devices 31. In an embodiment of the present invention, the center-to-center distance or spacing 72 between each of the optical fibers 11 may be the same or different.

FIG. 8C is a vertical cross section of yet another example system 800C in which a plurality of detents, channels, or similar grooves 57A-57n (collectively, "grooves 57") have been formed or otherwise disposed in the surface of the base or substrate 27 such that each of at least some of the plurality of optical fibers 11 are at least partially disposed within a respective groove 57. The placement of each of the plurality of optical fibers 11A-11n in a respective groove 57 formed in the substrate 27 effectively fixes and maintains the center-to-center spacing of the optical fibers 1, thereby forms a registered array, in accordance with an embodiment of the present invention. In an embodiment of the present invention, the substrate 27 may be a photolithographically defined substrate, for example, a micro-machined silicon, capable of positioning some or all of the plurality of optical fibers 11 with, for example, less than or equal to about a 2 micrometer (μm) positional error. In an embodiment of the present invention, the size and/or shape of the grooves may vary or may differ from another of the grooves.

FIG. 9A is a plan view of an illustrative spectral beam combiner system 900 that includes a third optical element 75 to provide a beam shaping capability to compensate for spectral broadening of the electromagnetic energy 22 that is introduced or caused by the dispersion device or system 20, in accordance with an embodiment described herein. FIG. 9B is an elevation view of the illustrative spectral beam combiner system 900 depicted in FIG. 9A, in accordance with an embodiment of the present invention. As shown in FIGS. 9A and 9B, the third optical element 75 (e.g., a cylindrical lens) may be disposed, positioned, or otherwise placed between the dispersion device or system 20 and the second optical element 23 to focus the electromagnetic energy from the dispersion device or system 20 such that all or a significant portion of the electromagnetic energy couples to the output fiber 25, rather than, for example, clipped at the edge of the output fiber 25. With increased focusing, there may be an increase in angular components injected into the output fiber core 25.

Figure 10:
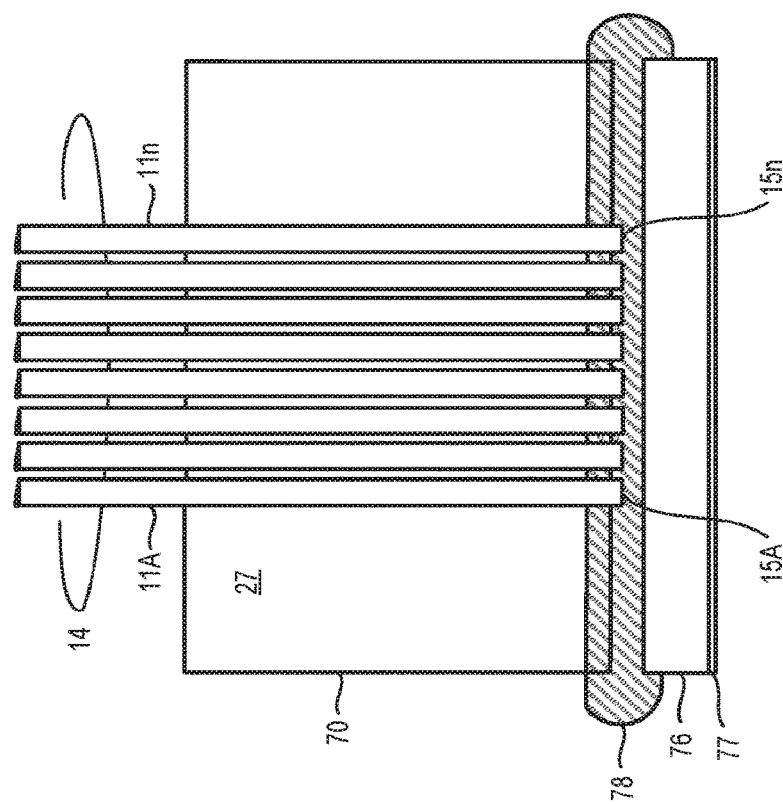
FIG. 10 is a plan view of an illustrative system that includes fiber bundle having a plurality of optical fibers disposed in, on, or about at least a portion of a surface of a substrate in which each of some or all of the plurality of optical fibers are coupled to an optical element having an anti-reflection coating using one or more bonding materials through which the electromagnetic energy carried by the plurality of fibers may propagate, in accordance with an embodiment of the present invention.

FIG. 10 is a plan view of an illustrative system 1000 that includes fiber bundle 14 having a plurality of optical fibers 11A-11n that may be disposed in, on, across or about at least a portion of a surface of a substrate 27 in which each of some or all of the plurality of optical fibers 11 are coupled to an optical element 76 using one or more bonding materials 78. In an embodiment of the present invention the electromagnetic energy carried by the plurality of fibers 11 may propagate. In at least some embodiments, the optical element 76 may include an optical flat as shown. The optical element 76 is at least partially transparent to the wavelength(s) of all or a portion of the electromagnetic energy exiting some or all of the plurality of optical fibers 11. In an embodiment of the present invention, a surface treatment, such as an anti-reflection film or coating 77 may be disposed on the surface of the optical element 76, opposite the plurality of optical fibers 11. In an embodiment of the present invention, the one or more bonding materials 78 may include but is not limited to an optically transparent cement such as Norland Optical Adhesive 61 ("NOA 61") manufactured by Norland Products, Inc. (CRANBURY, NJ). In an embodiment of the present invention, the cement may have an index of refraction matched to fused silica to beneficially minimize or even eliminate reflections at the interface to the fiber tips and the back surface of the glass.

Figure 11:
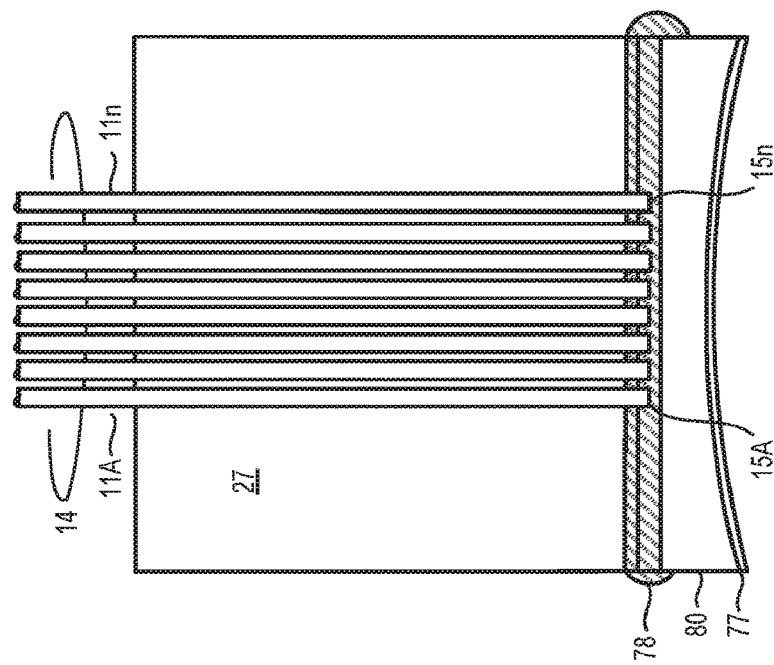
FIG. 11 is a plan view of an illustrative system that includes fiber bundle having a plurality of optical fibers disposed in, on, or about at least a portion of a surface of a substrate, and in which each of some or all of the plurality of optical fibers are coupled to a concave optical element (i.e., lens) using one or more bonding materials through which the electromagnetic energy carried by the plurality of optical fibers may propagate, in accordance with an embodiment of the present invention.

FIG. 11 is a plan view of an illustrative system 1100 that includes a fiber bundle 14 having a plurality of optical fibers 11A-11n disposed in, on, or about at least a portion of a surface of a substrate 27, in accordance with an embodiment of the present invention. As depicted in FIG. 11, each of some or all of the plurality of optical fibers 30 may be coupled to a concave element 80 (i.e., lens) using one or more bonding materials 78 through which the electromagnetic energy carried by the plurality of optical fibers 11,30 may propagate. In an embodiment of the present invention, the optical element 80 may have a plane surface on the side facing the fiber ends and a concave, convex, or cylindrical surface on the opposite side. The intended purpose of the curved surface is to correct curvature-of-field aberration of the first optical element 17 that may otherwise cause some of the optical fibers 11 to be out of focus. The concave optical element 80 is at least partially transparent to the wavelength(s) of all or a portion of the electromagnetic energy exiting some or all of the plurality of optical fibers 11,30. In an embodiment of the present invention, a surface treatment, such as an anti-reflection film or coating 77 may be disposed on the surface of the lens 76, opposite the plurality of optical fibers 11.

What is claimed is:

1. A spectral beam combiner system, comprising:
   a first electromagnetic energy output device including a first wavelength stabilization device inside the first electromagnetic energy output device and operable to output a first wavelength;
   a second electromagnetic energy output device including a second wavelength stabilization device inside the second electromagnetic energy output device and operable to output a second wavelength which is different from the first wavelength;
   a first optical device positioned transverse to an optical axis of the spectral beam combiner system that receives a plurality of electromagnetic energy inputs via a plurality of input fibers, wherein at least two of the electromagnetic energy inputs differ in wavelength, and that collimates the electromagnetic energy inputs and emits a collimated electromagnetic energy output;
   a grating positioned transverse to the optical axis, and after the first optical device along an optical path, that diffracts at least a portion of the collimated electromagnetic energy output emitted by the first optical device, and emits a collimated diffracted electromagnetic energy output; and
   a second optical device disposed transverse to the optical axis, and after the grating along an optical path, that focuses the collimated diffracted electromagnetic energy output and generates a focused electromagnetic energy output including the first wavelength and the second wavelength at a single focal point.

2. The spectral beam combiner system of claim 1, further comprising a plurality of multimode fibers optically coupled to the first optical device, wherein the first optical device receives the plurality of electromagnetic energy inputs via the plurality of multimode fibers.

3. The spectral beam combiner system of claim 2, wherein a first one of the plurality of multimode fibers is coupled to a first fiber coupled module and a second one of the plurality of multimode fibers is coupled to a second fiber coupled module.

4. The spectral beam combiner system of claim 2, further comprising a substrate, wherein each of the plurality of multimode fibers is positioned on the substrate such that a predetermined center-to-center distance between at least two of the plurality of multimode fibers is maintained.

5. The spectral beam combiner system of claim 1, further comprising a plurality of single mode fibers optically coupled to the first optical device, wherein the first optical device receives the plurality of electromagnetic energy inputs via the plurality of single mode fibers.

6. The spectral beam combiner system of claim 5, wherein a first one of the plurality of single mode fibers is coupled to a first diode laser and a second one of the plurality of single mode fibers is coupled to a second diode laser.

7. The spectral beam combiner system of claim 1, further comprising an output optical fiber positioned after the second optical device, along an optical path, that receives the focused electromagnetic energy output, and wherein the output optical fiber is a multimode fiber.

8. The spectral beam combiner system of claim 1, further comprising a plurality of optical fibers, wherein the plurality of electromagnetic energy inputs is received via the plurality of optical fibers.

9. The spectral beam combiner system of claim 8, further comprising a substrate, wherein the plurality of optical fibers is positioned on the substrate.

10. The spectral beam combiner system of claim 9, wherein a plurality of recesses is formed in a first surface of the substrate.

11. The spectral beam combiner system of claim 9, wherein the plurality of electromagnetic energy inputs emitted by each of the plurality of optical fibers comprises electromagnetic energy having a wavelength that is selected from a range of wavelengths between and including 400 nm and 1000 nm.

12. The spectral beam combiner system of claim 1, wherein the grating is disposed at an angle of 45 degrees with respect to the optical axis.

13. The spectral beam combiner system of claim 1, further comprising a third optical element disposed transverse to the optical axis and positioned between the grating and the second optical device, wherein the third optical element shapes at least a portion of the collimated diffracted electromagnetic energy output.

14. The spectral beam combiner system of claim 1, wherein the grating comprises a diffraction grating that diffracts at least a portion of the collimated electromagnetic energy output at an angle that is selected from a range of angles between and including 45 degrees and 135 degrees.

15. The spectral beam combiner system of claim 14, further comprising a first electromagnetic energy source and a second electromagnetic energy source, and wherein the first electromagnetic energy source is coupled to a first one of the plurality of input fibers and the second electromagnetic energy source is optically coupled to a second one of the plurality of input fibers.

16. The spectral beam combiner system of claim 15, wherein the first electromagnetic energy source is a fiber coupled module.

17. The spectral beam combiner system of claim 16, wherein the fiber coupled module is a wavelength-stabilized electromagnetic radiation source.

18. The spectral beam combiner system of claim 15, further comprising a power supply coupled to the first electromagnetic energy source and the second electromagnetic energy source.

19. The spectral beam combiner system of claim 15, further comprising a heat exchange surface thermally coupled to the first electromagnetic energy source and the second electromagnetic energy source, wherein the heat exchange surface removes at least a portion of a thermal energy generated by the first electromagnetic energy source and the second electromagnetic energy source.

20. The spectral beam combiner system of claim 14, wherein the plurality of electromagnetic energy inputs emitted by each of the input fibers included in the plurality of input fibers comprises electromagnetic energy having wavelengths that are selected from a range of wavelengths between and including 800 nm and 1000 nm.

* * * * *